United States Patent
Ota et al.

(10) Patent No.: US 6,645,701 B1
(45) Date of Patent: Nov. 11, 2003

(54) EXPOSURE METHOD AND EXPOSURE APPARATUS

(75) Inventors: Kazuya Ota, Tokyo (JP); Shin-ichi Takagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/630,548

(22) Filed: Aug. 1, 2000

Related U.S. Application Data

(63) Continuation-in-part of application No. 09/299,152, filed on Apr. 26, 1999, now abandoned, which is a continuation of application No. 08/752,875, filed on Nov. 20, 1996, now abandoned, and a continuation-in-part of application No. 09/299,152, which is a continuation-in-part of application No. 08/990,580, filed on Dec. 15, 1997, now abandoned.

(30) Foreign Application Priority Data

| Nov. 22, 1995 | (JP) | .............................. 7-328281 |
| Feb. 23, 1996 | (JP) | .............................. 8-61848 |
| Dec. 17, 1996 | (JP) | .............................. 8-353551 |

(51) Int. Cl.$^7$ .......................... G03B 27/00; H01J 37/00
(52) U.S. Cl. ...................... 430/311; 430/327; 355/30
(58) Field of Search ................ 430/311, 327; 355/30

(56) References Cited

U.S. PATENT DOCUMENTS

| 4,503,335 A | * | 3/1985 | Takahashi | .................. 355/30 |
| 4,704,348 A | * | 11/1987 | Koizumi et al. | ............ 430/327 |
| 4,720,732 A | * | 1/1988 | Tsutsui | ........................ 355/30 |
| 4,814,625 A | | 3/1989 | Yabu | ......................... 250/548 |
| 4,844,568 A | * | 7/1989 | Suzuki et al. | ............ 250/491.1 |
| 4,916,322 A | * | 4/1990 | Glavish et al. | ................ 355/30 |
| 4,989,031 A | | 1/1991 | Kamiya | ....................... 355/30 |
| 4,998,821 A | | 3/1991 | Ohta et al. | .................. 353/122 |
| 5,063,582 A | | 11/1991 | Mori et al. | .................... 378/34 |
| 5,134,436 A | | 7/1992 | Fujioka | ....................... 355/30 |
| 5,231,291 A | * | 7/1993 | Amemiya et al. | ....... 250/443.1 |
| 5,581,324 A | | 12/1996 | Miyai et al. | .................. 355/53 |
| 5,610,965 A | | 3/1997 | Mori et al. | .................... 378/34 |
| 5,738,165 A | | 4/1998 | Imai | ......................... 165/80.2 |
| 5,747,202 A | | 5/1998 | Tanaka | ........................ 430/30 |
| 5,795,687 A | | 8/1998 | Yasuda | ........................ 430/22 |
| 5,912,096 A | * | 6/1999 | Hada | .............................. 430/30 |
| 6,153,877 A | * | 11/2000 | Ashida | ........................ 250/216 |
| 6,338,776 B1 | * | 1/2002 | Pommer | ................ 204/192.12 |

OTHER PUBLICATIONS

M.S. Hibbs, System Overview of Optical Steppers and Scanners (pp 1–107)□□Microlithography, Science and Technology.□□eds: J.R.Sheats and B.W.Smith□□Marcel Dekker, NY (1998).*

* cited by examiner

Primary Examiner—Mark F. Huff
Assistant Examiner—Kripa Sagar
(74) Attorney, Agent, or Firm—Armstrong, Westerman & Hattori, LLP

(57) ABSTRACT

Prior to an exposure process in which a pattern formed on a mask is transferred by exposure onto photo-sensitized substrates, the temperature of the mask and/or the temperature of the photosensitized substrate is/are adjusted to an equilibrium temperatures which would be established during an exposure process, so that any inconvenience may be avoided, which may otherwise arise due to temperature changes with time in the environment of the exposure apparatus. Further, in a waiting interval during which no control sequence for exposure of a substrate is performed, a substrate stage for carrying a substrate is caused to wait at a position in the exposure apparatus at which stability against heat is obtained, so that any adverse effects may be minimized, which could occur due to changes in the temperature gradients prevailing in the exposure apparatus.

6 Claims, 12 Drawing Sheets

Fig. 1
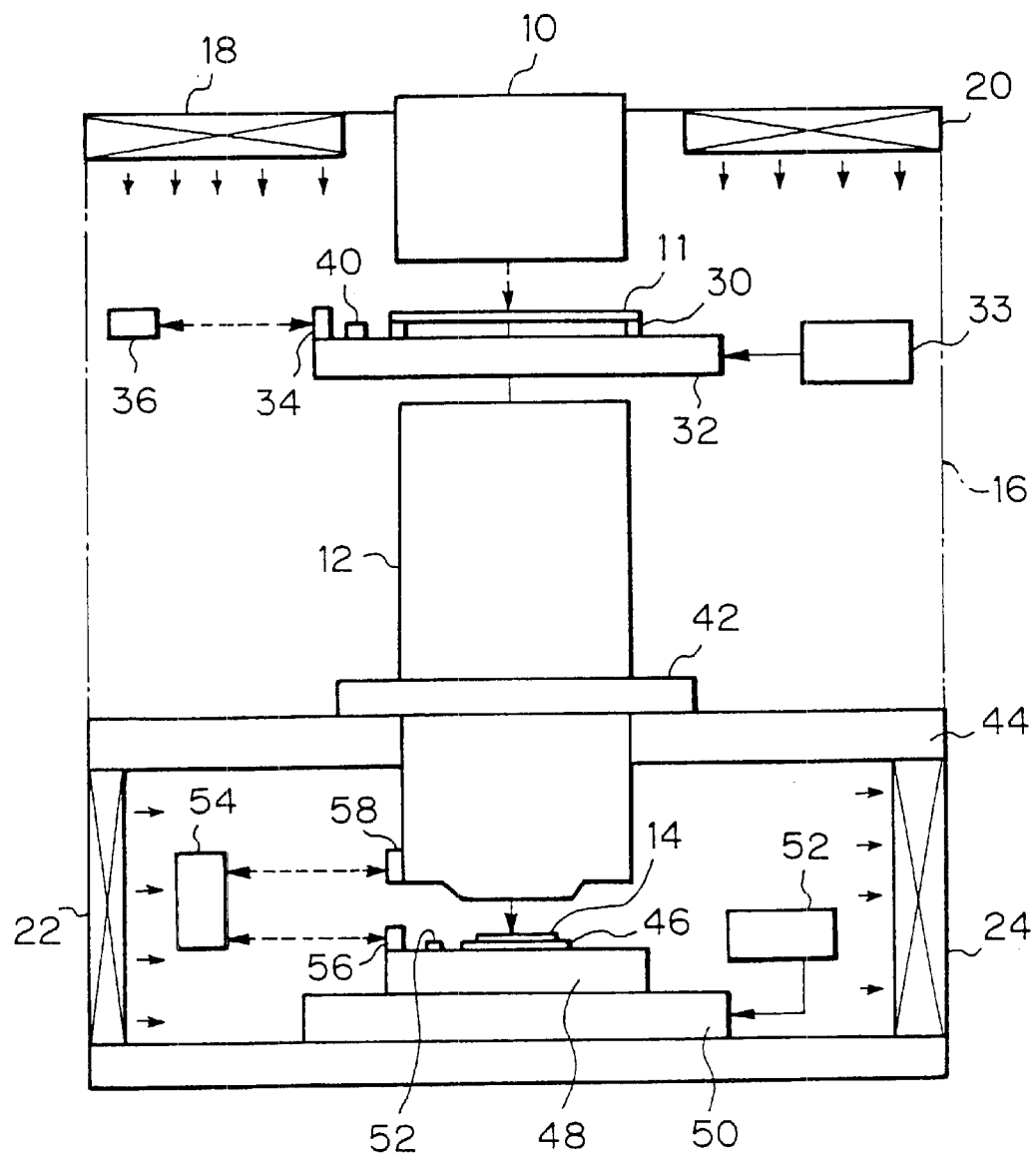
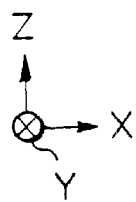

EXPOSURE METHOD AND EXPOSURE APPARATUS

CROSS REFERENCE TO RELATED APPLICATION

This application is a Continuation-in-Part Application of U.S. patent application Ser. No. 09/299,152 filed Apr. 26, 1999, now abandoned (which is a Continuation Application of U.S. patent application Ser. No. 08/752,875 filed on Nov. 20, 1996 now abandoned) and U.S. patent application Ser. No. 08/990,580 filed Dec. 15, 1997 now abandoned.

BACKGROUND OF THE INVENTION

The present invention relates to an exposure apparatus, exposure method, method of controlling substrate stage and method of controlling mask stage, and in particular to such apparatus and methods taking into consideration various temperature-related environmental factors of an exposure apparatus, such as the temperature changes with time which may occur in the exposure apparatus and the temperature gradients prevailing in the exposure apparatus.

Over the years, it has been continuously desired to achieve higher and higher complexity in semiconductor devices, which in turn has required higher accuracy in positioning of a photosensitized substrate and a mask in exposure apparatuses. One of the important factors affecting the accuracy in positioning of a mask and a photosensitized substrate is the ambient air temperature, which is one of the environmental factors affecting an exposure apparatus. Specifically, in an exposure apparatus including some kind of optical position measurement devices such as interferometers, instability in an ambient air temperature in the exposure apparatus may produce non-negligible air fluctuations in the optical paths of the interferometers and/or cause uneven heat expansions of various components in the apparatus such as a stage for carrying a mask and a stage for carrying a photosensitized substrate. For this reason, it has become common to house the entire exposure apparatus in a constant temperature chamber. In such a constant temperature chamber, one or more stream of temperature-controlled air is introduced therein so as to flow around the exposure apparatus, so that the apparatus may be kept at substantially a constant temperature. This may suppress undesirable temperature changes to a certain extent, which temperature changes may occur during exposure operations performed by the exposure apparatus.

However, this technique is insufficient for improving accuracy in positioning of a mask and a photo-sensitive substrate such as meets today's requirements.

By way of example, consider an exposure apparatus of the step-and-repeat type, in which a pattern formed on a mask is transferred onto a photosensitive substrate through a step-and-repeat exposure sequence. The exposure apparatus comprises a movable substrate stage for carrying a substrate, and the substrate stage is caused to wait at a predefined position, such as the loading position for loading on/off the substrate, for a time interval during which no exposure process is performed. Also, in an exposure apparatus of the type in which a photosensitized substrate and a mask are moved in synchronism by means of a substrate stage and a mask stage, the mask stage carrying the mask is generally caused to wait at a predefined position for a time interval during which no exposure process is performed.

In either case, the exposure apparatus produces more heat (per unit of time) during an exposure process than in a waiting interval prior to the commencement of the exposure process, so that the temperatures at regions near and around the exposure apparatus may not be stable until a substantial length of time, such as some tens of minutes to several hours, has elapsed from the commencement of the exposure process. As a result, the temperatures of some components of the exposure apparatus will often change with time during an exposure process, which leads to a substantial deviation in the measurements obtained from the position measurement systems used, between those obtained just after and those obtained several hours after the commencement of the exposure process. Apparently, such deviation will cause a deterioration in accuracy in the alignment established for an exposure operation, which may result in an exposure failure.

Further, the temperature distribution within the exposure apparatus is not uniform, especially around the substrate stage and/or the mask stage, because the exposure apparatus has several heat sources which produce temperature gradients. In addition, any changes in position of the substrate stage or the mask stage may vary the courses of the air streams flowing within the exposure apparatus, which may in turn lead to variations in temperature gradients within the exposure apparatus. Therefore, if the waiting positions for the substrate stage and the mask stage are defined without taking into consideration the temperature-related environmental factors within the exposure apparatus, the stability of an exposure process has to have certain limitations imposed thereon, such as possible occurrence of significant errors in the alignment accuracy due to temperature gradients.

SUMMARY OF THE INVENTION

In view of the foregoing, it is an object of the present invention to provide an exposure apparatus which is capable of suppressing any inconveniences which could be otherwise imposed by the temperature changes with time around the exposure apparatus.

It is another object of the present invention to provide an exposure method, in which the temperature at a region near at least one of a mask having a pattern formed thereon and a photosensitized substrate onto which the pattern of the mask is to be transferred by exposure is so adjusted that any inconvenience is avoided, which could be otherwise occur due to temperature changes with time around the exposure apparatus.

It is a further object of the present invention to provide a method of controlling a substrate stage in an exposure apparatus, in which the substrate stage is caused to wait at a position in the exposure apparatus at which stability against heat is obtained, so that the temperature gradients in the exposure apparatus and the effects of any changes in these temperature gradients may be minimized.

It is a yet further object of the present invention to provide a method of controlling a mask stage in an exposure apparatus, in which the mask stage is caused to wait at a position in the exposure apparatus at which stability against heat is obtained, so that the temperature gradients in the exposure apparatus and the effects of any changes in these temperature gradients may be minimized.

It is a still further object of the present invention to provide an exposure apparatus including a control system for a substrate stage, in which the substrate stage is caused to wait at a position in the exposure apparatus at which stability against heat is obtained, so that the temperature gradients in the exposure apparatus and the effects of any changes in these temperature gradients may be minimized.

It is a still further object of the present invention to provide an exposure apparatus including a control system for a mask stage, in which the mask stage is caused to wait at a position in the exposure apparatus at which stability against heat is obtained, so that the temperature gradients in the exposure apparatus and the effects of any changes in these temperature gradients may be minimized.

According to an embodiment of the present invention, there is provided an exposure apparatus for transferring a pattern formed on a mask onto a photosensitized substrate by exposure, comprising: a temperature measurement device for measuring temperature at a region near at least one of the mask and the photosensitized substrate; and a temperature adjustment device for comparing measurement data from the temperature measurement device with a preset desired value so as to adjust, prior to an exposure process, temperature at the region near at least one of the mask and the photosensitized substrate to an equilibrium temperature which would be established during an exposure process.

In the embodiment of the present invention described above, the exposure apparatus may further comprise a decision making device for determining, based on measurement results from the temperature measurement device and the equilibrium temperature, whether an exposure process is to be performed or not. In the case where the mask and the photosensitized substrate is held on respective stages each capable of two-dimensional movement, temperature adjustment may be achieved by moving at least one of the stages. Also, the exposure apparatus may comprise a heat supply device disposed near the mask for supplying a predetermined amount of heat based on the transmittance of the mask with respect to an exposure light beam passing through the mask. Further, in the case where the exposure apparatus comprises a first position measurement device for measuring a position of the mask and a second position measurement device for measuring a position of the photosensitized substrate, the temperature measurement device may preferably comprise a first temperature sensing device disposed near the first position measurement device and a second temperature sensing device disposed near the second position measurement device.

With the embodiment of the present invention, an exposure process may be commenced after the temperature at a region near the mask and/or the temperature at a region near the photosensitized substrate has reached an equilibrium temperature which would be established during an exposure process, so that successful exposure operations may be ensured.

In the case where the temperature adjustment is achieved by moving the stage carrying the mask and/or the stage carrying the photosensitized substrate, not only the mask and the photosensitized substrate but also the surrounding components are placed under conditions which are very close to those experienced in an actual exposure process as early as in the preliminary step before the commencement of the following exposure process. In the case where a heat supply device is disposed near the mask for supplying a predetermined amount of heat based on the transmittance of the mask with respect to an exposure light beam passing through the mask, the temperature adjustment at a region near the mask may be quickly achieved. More-over, by using the temperature measurement device to measure the temperature at a region near the first position measurement device for measuring a position of the mask as well as to measure the temperature at a region near the second position measurement device for measuring a position of the photosensitized substrate, and by adjusting the temperatures at these regions, any variations in the references for alignment of the mask and the photosensitized substrate may be suppressed, which variations could be otherwise caused by the temperature changes with time which may occur during an exposure process. This results in a significant improvement in accuracy in alignment of the mask and the photosensitized substrate.

According to an embodiment of the present invention, there is provided a method of transferring a pattern formed on a mask onto a photosensitized substrate by exposure, the method comprising the step of: adjusting, prior to an exposure process, a temperature at a region near at least one of the mask and the photosensitized substrate to an equilibrium temperature which would be established during an exposure process. The temperature adjustment may be achieved by performing a mimic exposure process, or alternatively, by supplying a stream of gas to a region near at least one of the mask and the photo-sensitized substrate, the gas having a temperature which achieves the equilibrium temperature which would be established during an exposure process.

With the embodiment of the present invention described above, the temperature at a region near the mask and/or the temperature at a region near the photosensitized substrate is/are adjusted, prior to an exposure process, to the equilibrium temperature which would be established during an exposure process, so that the temperatures of the components around the mask and/or the photosensitized substrate scarcely change even after a long-time exposure process is continued. Thus, no error is introduced in the mask and/or the photosensitized substrate or in the precision components disposed around them by the temperature changes with time which could otherwise occur.

In the case where the temperature adjustment is achieved by performing a mimic exposure process, not only the mask and the photosensitized substrate but also the surrounding components are placed under the conditions which are very close to those experienced in an actual exposure process as early as in the preliminary step before the commencement of the following exposure process. Further, in the case where a stream of temperature-controlled gas is supplied to a region near the mask and/or the photosensitized substrate, the adjustment of the temperature of the mask and/or the photosensitized substrate may be quickly achieved.

According to an embodiment of the present invention, there is provided a method of controlling a substrate stage in an exposure apparatus, the substrate stage being capable of holding thereon and moving therewith a substrate onto which a given pattern is to be transferred by exposure, the method comprising the step of: causing the substrate stage to wait, for a waiting interval during which no control sequence for exposure of the substrate on the substrate stage is performed, at a position in the exposure apparatus at which stability against heat is obtained. The position in the exposure apparatus at which stability against heat is obtained may be determined as a temporal average of the positions of the substrate stage over a time interval during which the control sequence for exposure of the substrate on the substrate stage is performed.

Such a method may comprise the steps of: determining, based on temperatures measured by each temperature sensors, average temperatures at a plurality of regions on the substrate stage over a time interval during which a control sequence for exposure of the substrate on the substrate stage is performed; determining average temperature positions which are such positions of the substrate stage that correspond to respective average temperatures of the temperature sensors; determining an average position of the average temperature positions; and causing the substrate stage to wait at the average position. Alternatively, such a method may comprise causing the substrate stage to sequentially circulate among the average temperature positions, which are such positions of the substrate stage that correspond to respective average temperatures of the temperature sensors, so as to place the substrate stage in a wait state. The present invention further provides a method of controlling a mask stage in an exposure apparatus, in which the waiting position for the mask stage is determined in the same manner.

According to an embodiment of the present invention, there is provided an exposure apparatus including a control system for a substrate stage capable of holding thereon and moving therewith a substrate onto which a given pattern is to be transferred by exposure, wherein the control system comprising: a plurality of temperature sensors, disposed at a plurality of regions on the substrate stage, for sensing ambient air temperatures in a time interval during which a control sequence for exposure of the substrate on the substrate stage is performed; an arithmetic operation device for determining an average temperature of the temperatures measured by each of the temperature sensors, determining average temperature positions which are such positions of the substrate stage that correspond to respective average temperatures of the temperature sensors, and determining an average position of the average temperature positions; and a drive device for causing the substrate stage to wait at the average position.

With the embodiments, the substrate stage is caused to wait at a position in the exposure apparatus at which stability against heat is obtained, so that any effects of the temperature gradients in the exposure apparatus on the next exposure process may be substantially eliminated. More specifically, the substrate is caused either to wait at a position which corresponds to a temporal average of the positions of the substrate stage over a time interval during which a control sequence for exposure of a substrate on the substrate stage is performed or to sequentially circulate among the average temperature positions, so that the substrate stage may be placed under the same temperature conditions as experienced during an actual exposure process, even in a waiting interval during which no exposure process is performed.

According to an embodiment of the present invention, there is provided an exposure method in which, during a predetermined period of time during which exposure control operations are suspended, at least one of the substrate stage and the mask stage is moved so as to trace its movement in an actual operation in which exposure control operations are conducted. In the above-mentioned exposure method of the present invention, it is preferred to perform irradiation of exposure light during the predetermined period of time during which exposure control operations are suspended, in the same manner as in the actual operation.

An exposure apparatus according to an embodiment of the present invention, used in the above-mentioned method comprises:

an illumination device which irradiates a mask with exposure light;

a movable mask stage adapted to hold the mask thereon;

a movable substrate stage adapted to holding a photosensitive substrate thereon;

a mask stage-moving device which moves the mask stage;

a substrate stage-moving device which moves the substrate stage; and a controller which controls at least one of the substrate stage-moving device and the mask stage-moving device during a predetermined period of time during which exposure control operations are suspended, to thereby move at least one of the substrate stage and the mask stage in a manner such that movement of the at least one of the substrate stage and the mask stage in an actual operation in which exposure control operations are conducted is traced. In the exposure apparatus of the present invention, it is preferred that the controller controls the illumination device so as to perform irradiation of the exposure light in the same manner as in the actual operation. It is more preferred that the exposure apparatus further comprise a temperature sensor which measures a temperature of at least one site on the substrate stage and the amount of the exposure light irradiated by the illumination device be controlled by the controller, based on a measurement value of temperature of the temperature sensor.

In the embodiment of the present invention arranged as mentioned above, when the substrate stage or the mask stage is moved during a predetermined period of time during which exposure control operations are suspended (hereinafter, frequently referred to simply as "standby period"), in a manner such that movement of the substrate stage or the mask stage in an actual operation in which exposure control operations are conducted (hereinafter, frequently referred to simply as "actual operation") is traced, temperature conditions in an area including the substrate stage and the mask stage during the standby period become very close to those in the actual operation, due to temperature gradient changes which are caused by the movement of the substrate stage or the mask stage. Further, in the present invention, when irradiation of exposure light is performed during the standby period in the same manner as in the actual operation, the temperature conditions during the standby period become substantially the same as those in the actual operation, because not only temperature gradient changes due to movement of the substrate stage or the mask stage, but also temperature changes due to absorption of energy of exposure light occur.

According to an embodiment of the present invention, there is provided an exposure apparatus for transferring a pattern formed on a mask to a photosensitive substrate, comprising:

an illumination device which irradiates the mask with exposure light;

a movable mask stage adapted to hold the mask thereon;

a movable substrate stage adapted to hold the photosensitive substrate thereon;

a mask stage-moving device which moves the mask stage;

a substrate stage-moving device which moves the substrate stage; and a controller which controls at least one of the substrate stage-moving device and the mask stage-moving device during a predetermined period of time during which exposure control operations are suspended, to thereby move at least one of the substrate stage and the mask stage in a manner such that movement of the at least one of the substrate stage and the mask stage in an actual operation in which exposure control operations are conducted is traced.

According to an embodiment of the present invention, there is also provided a method for determining a standby position of at least one of a substrate stage and a mask stage in an exposure apparatus provided in a chamber, comprising the steps of:

measuring an internal temperature of the chamber; and determining a thermally stable standby position of the at least one of the substrate stage and the mask stage, based on a measurement value of temperature obtained in the measuring step.

According to an embodiment of the present invention, there is also provided a method for determining a standby position of a wafer stage in an exposure apparatus, comprising the steps of:

determining a plurality of positions at which the wafer stage is held when exposure control operations with respect to the wafer stage are conducted;

determining the time during which the wafer stage is held at each of the plurality of positions;

determining an average position of the plurality of positions relative to the time; and determining the average position as the standby position.

According to an embodiment of the present invention, there is also provided a method for determining a standby position of a reticle stage in an exposure apparatus, comprising the steps of:

determining a plurality of positions at which the reticle stage is held when exposure control operations with respect to the reticle stage are conducted;

determining the time during which the reticle stage is held at each of the plurality of positions;

determining an average position of the plurality of positions relative to the time; and determining the average position as the standby position.

According to an embodiment of the present invention, there is also provided a method for controlling an exposure apparatus, the exposure apparatus having a wafer stage for performing exposure of a plurality of wafers, the plurality of wafers being adapted to be successively provided on the wafer stage and irradiated with exposure light, comprising the steps of:

determining a first time point at which exposure of one of the plurality of wafers is completed;

determining a second time point at which the one wafer after exposure is replaced by another wafer;

determining an average position of a plurality of positions of the wafer stage when exposure control operations with respect to the wafer stage are conducted, the determination of the average position being made, relative to the time during which the wafer stage is held at each of the plurality of positions; and holding the wafer stage at the average position during the period of time between the first time point and the second time point.

According to an embodiment of the present invention, there is also provided a method for controlling an exposure apparatus, the exposure apparatus having a wafer stage and a reticle stage for performing exposure of a plurality of wafers, the plurality of wafers being adapted to be successively provided on the wafer stage and irradiated with exposure light, comprising the steps of:

determining a first time point at which exposure of one of the plurality of wafers is completed;

determining a second time point at which the one wafer after exposure is replaced by another wafer;

determining an average position of a plurality of positions at which the reticle stage is held when exposure control operations with respect to the reticle stage are conducted, the determination of the average position being made, relative to the time during which the reticle stage is held at each of the plurality of positions; and holding the reticle stage at the average position during the period of time between the first time point and the second time point.

According to an embodiment of the present invention, there is also provided a standby position-determining device for determining a standby position of a wafer stage in an temperature sensors;

a calculating part which calculates an average temperature value of each of the plurality of temperature sensors, based on the information on the measurement values of temperatures stored in the memory; and a controller which drives the wafer stage-moving device to thereby move the wafer stage and determines average-temperature positions of the wafer stage at each of which the measurement value of temperature of the temperature sensor becomes the average temperature value of the temperature sensor, with respect to each of the plurality of temperature sensors, wherein the calculating part determines an average position of the average-temperature positions of the wafer stage, and the controller determines the average position as a standby position of the wafer stage and moves the wafer stage to the average position when exposure control operations are suspended.

According to an embodiment of the present invention, there is also provided an exposure apparatus for transferring a pattern formed on a reticle to a wafer, comprising:

a movable reticle stage for holding the reticle thereon;

a reticle stage-moving device which moves the reticle stage;

a plurality of temperature sensors provided on the reticle stage to perform measurements of temperatures when exposure apparatus, comprising:

a temperature sensor provided on the wafer stage; and a calculating part which determines a thermally stable standby position of the wafer stage, based on a measurement value of temperature of the temperature sensor.

According to an embodiment of the present invention, there is also provided a standby position-determining device for determining a standby position of a reticle stage in an exposure apparatus, comprising:

a temperature sensor provided on the reticle stage; and a calculating part which determines a thermally stable standby position of the reticle stage, based on a measurement value of temperature of the temperature sensor.

According to an embodiment of the present invention, there is also provided an exposure apparatus for transferring a pattern formed on a reticle to a wafer, comprising:

a movable wafer stage adapted to hold the wafer thereon;

a wafer stage-moving device which moves the wafer stage;

a plurality of temperature sensors provided on the wafer stage to perform measurements of temperatures when the wafer stage is moved in an actual operation in which exposure control operations are conducted;

a memory which stores therein information on measurement values of temperatures of the plurality of the reticle stage is moved in an actual operation in which exposure control operations are conducted;

a memory which stores therein information on measurement values of temperatures of the plurality of temperature sensors;

a calculating part which calculates an average temperature value of each of the plurality of temperature sensors, based on the information on the measurement values of temperatures stored in the memory; and a controller which drives the reticle stage-moving device to thereby move the reticle stage and determines average-temperature positions of the reticle stage at each of which the measurement value of temperature of the temperature sensor becomes the average temperature value of the temperature sensor, with respect to each of the plurality of temperature sensors, wherein the calculating part determines an average position of the average-temperature positions of the reticle stage, and the controller determines the average position as a standby position of the reticle stage and moves the reticle stage to the average position when exposure control operations are suspended.

According to an embodiment of the present invention, there is also provided an exposure apparatus for transferring a pattern formed on a reticle to a wafer, comprising:

a movable wafer stage adapted to hold the wafer thereon;

a wafer stage-moving device which moves the wafer stage;

a plurality of temperature sensors provided on the wafer stage to perform measurements of temperatures when the wafer stageiis moved in an actual operation in which exposure control operations are conducted;

a memory which stores therein information on measurement values of temperatures of the plurality of temperature sensors;

a calculating part which calculates an average temperature value of each of the plurality of temperature sensors, based on the information on the measurement values of temperatures stored in the memory; and a controller connected to the wafer stage-moving device to move the wafer stage in a predetermined order between average-temperature positions of the wafer stage during a period of time during which exposure control operations are suspended, the average-temperature positions of the wafer stage being the positions at each of which the measurement value of temperature of the temperature sensor becomes the average temperature value of the temperature sensor, with respect to each of the plurality of temperature sensors.

According to an embodiment of the present invention, there is further provided an exposure apparatus for transferring a pattern formed on a reticle to a wafer, comprising:

a movable reticle stage adapted to hold the reticle thereon;

a reticle stage-moving device which moves the reticle stage;

a plurality of temperature sensors provided on the reticle stage to perform measurements of temperatures when the reticle stage is moved in an actual operation in which exposure control operations are conducted;

a memory which stores therein information on measurement values of temperatures of the plurality of temperature sensors;

a calculating part which calculates an average temperature value of each of the plurality of temperature sensors, based on the information on the measurement values of temperatures stored in the memory; and a controller connected to the reticle stage-moving device to move the reticle stage in a predetermined order between average-temperature positions of the reticle stage during a period of time during which exposure control operations are suspended, the average-temperature positions of the reticle stage being the positions at each of which the measurement value of temperature of the temperature sensor becomes an average temperature value of the temperature sensor, with respect to each of the plurality of temperature sensors.

The embodiment of the present invention arranged as mentioned above is advantageous in that temperature gradient changes in the exposure apparatus are minimized, so that an operation of exposure can be stably conducted.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 1 is a schematic view (frontal elevation) showing an arrangement of a scanning projection exposure apparatus according to one embodiment of the present invention;

DETAILED DESCRIPTION OF THE INVENTION

The present invention will now be described in more detail with reference to preferred embodiments thereof. The preferred embodiments show exemplified applications of the present invention to scanning projection exposure apparatuses used in fabrication of semiconductor devices.

Figure 2:
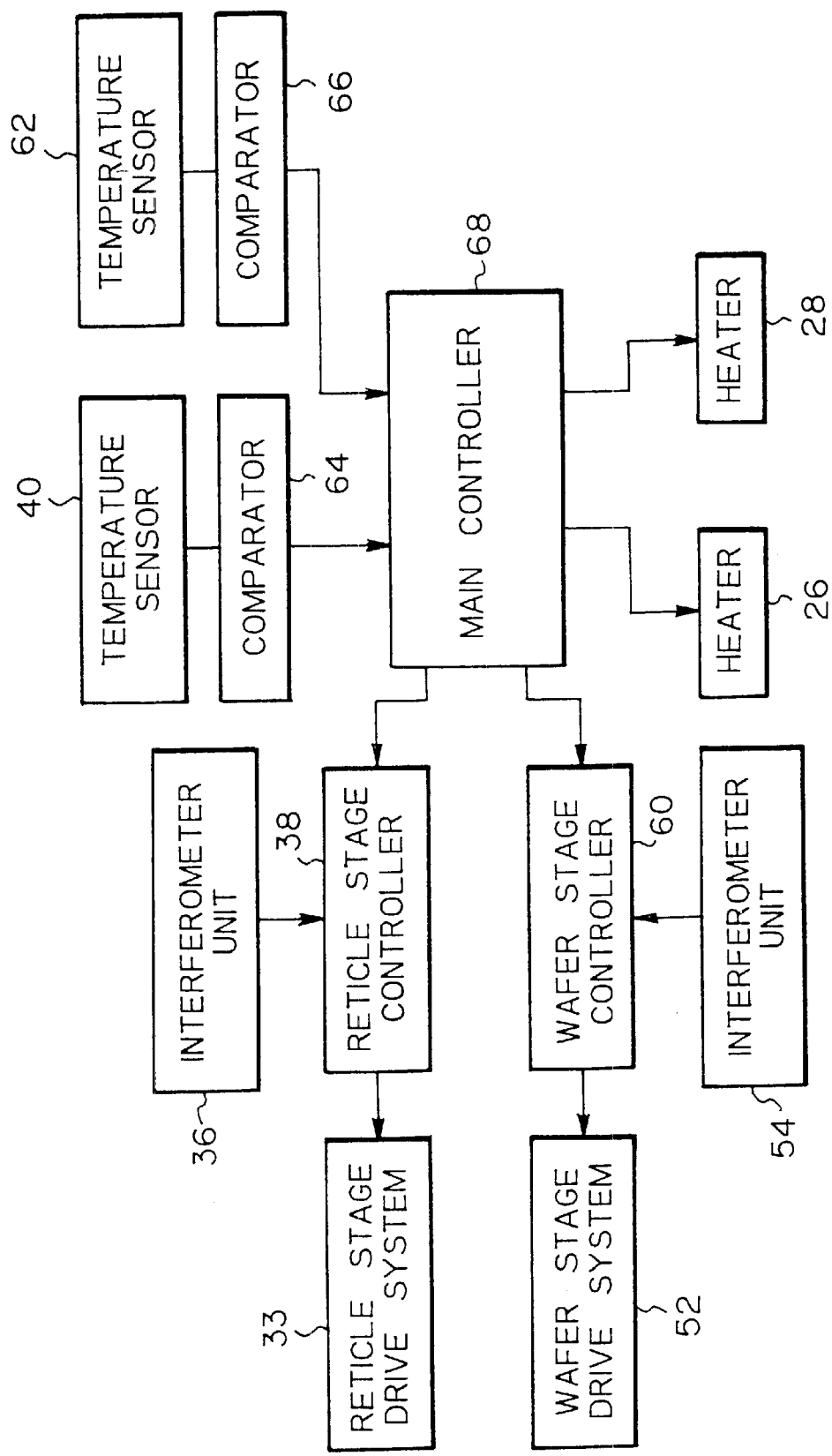
FIG. 2 is a block diagram showing a control system used in the exposure apparatus shown in FIG. 1.

FIG. 1 shows a general arrangement of a scanning projection exposure apparatus according to one embodiment of the present invention, and FIG. 2 is a block diagram showing a control system used in the exposure apparatus. The exposure apparatus includes an illumination optical system 10 serving to emit an exposure light beam for illuminating a reticle 11, so that an image of a pattern formed on the reticle 11 may be transferred through a projection optical system 12 onto a wafer 14. The entire exposure apparatus is housed in a constant temperature chamber 16 having its internal environment temperature-controlled with an allowable limit for temperature change less than about ±0.1 degree of centigrade. The constant temperature chamber 16 has upper air outlets 18 and 20 for introducing into the chamber streams of temperature-controlled air directed to flow around the reticle 11, a lower air outlet 22 for introducing into the chamber a stream of temperature-controlled air directed to flow around the wafer 14, and an air inlet 24 for removing out of the chamber streams of air having passed the wafer 14. The streams of air introduced through the upper air outlets 18 and 20 enter the chamber after being heated by a heater 26 (FIG. 2) and the stream of air introduced through the lower air outlet 22 enters the chamber after heated by another heater 28 (FIG. 2).

As shown in FIG. 1, the reticle 11 is held on a reticle holder 30 by a vacuum suction, and thereby secured on a reticle stage 32. The reticle stage 32 is movable in the scanning direction (or the Y-direction) at a predetermined velocity by means of a reticle stage drive system 33 including a linear motor and an associated mechanism of any suitable type. A movable mirror 34 is fixedly mounted on the movable reticle stage 32 for reflecting back a laser beam emitted from an associated interferometer unit 36, which is capable of measuring the position of the reticle stage 32 with a resolution of 0.6 nm nanometers). The combination of the interferometer unit 36 and the movable mirror 34 shown in FIG. 1 is for measurement of the position of the reticle stage 32 in the non-scanning direction (or the X-direction). Though not shown, there is provided another similar combination of interferometer unit and movable mirror for measurement of the position of the reticle stage 32 in the scanning direction (or the Y-direction). The measurement result obtained from the interferometer unit 36, as represented by a single block 36 in FIG. 2, is supplied to a reticle stage controller 38 (FIG. 2), which serves to control the reticle stage drive system 33 in accordance with signal from the interferometer units 36. Also provided on the reticle stage 32 is a temperature sensor 40 for measuring the temperature of the reticle stage 32.

The projection optical system 12 has a barrel with a flange 42 through which the projection optical system 12 is secured on a frame 44. The wafer 14 lying under the projection optical system 12 is held on a wafer holder 46 by a vacuum suction. The wafer holder 46 is carried on a Z-stage 48 which is constructed for adjustment of the position of the wafer 14 in the Z-direction as well as of the inclination of the wafer 14. The Z-stage 48 is in turn carried on an XY-stage 50 which is constructed for adjustment of the position of the wafer 14 both in the X- and Y-direction, or in other words, for two-dimensional position adjustment of the wafer 14. The Z-stage 48 and the XY-stage 50 are driven by a wafer stage drive system 52 including a linear motor and an associated mechanism of any suitable type.

A movable mirror 56 is fixedly mounted on the (movable) Z-stage 56 for reflecting back a laser beam emitted from an interferometer unit 54. A fixed mirror 58 is fixedly mounted on the (fixed) barrel of the projection optical system 12 at the lower end thereof for reflecting back another laser beam emitted from the interferometer unit 54. The reflected laser beams from the movable mirror 56 and the fixed mirror 58 combine together to form an interference beam, which is used to measure the position of the XY-stage 50 with a resolution of 0.6 nm. The combination of the interferometer unit 54 and the mirrors 56 and 58 shown in FIG. 1 is for measurement of the position of the XY-stage 50 in the X-direction. Though not shown, there is provided another similar combination of interferometer unit and mirrors for measurement of the position of the XY-stage 50 in the Y-direction. The measurement result obtained from the interferometer unit 54, as represented by a single block 54 in FIG. 2, is supplied to a wafer stage controller 60 (FIG. 2), which serves to control the wafer stage drive system 52 in accordance with signal from the interferometer units 54. Also provided on the Z-stage 48, and between the wafer holder 46 and the movable mirror 56, is a temperature sensor 62 for measuring the temperature of the Z-stage 48.

Referring next to FIG. 2 along with other figures, an arrangement of a temperature control system used in the embodiment will be described. The measurement data obtained from the temperature sensors 40 and 62 are supplied to comparators 64 and 66, respectively, at which the measured values are compared with respective, predefined desired values. The desired values may be the values of the equilibrium temperatures which would be established during an actual exposure process. Such desired values may be obtained during an actual exposure process, i.e., may be obtained experimentally. Alternatively, the desired values may be calculated from the values of relevant factors such as the transmittance (or reflectance) of the reticle used, the power of the exposure light beam, etc. The output signals from the comparator 64 and 66 are supplied to a main controller 68. The main controller 68 serves to control the reticle stage controller 38, wafer stage controller 60 and the heaters 26 and 28 if required.

Figure 3:
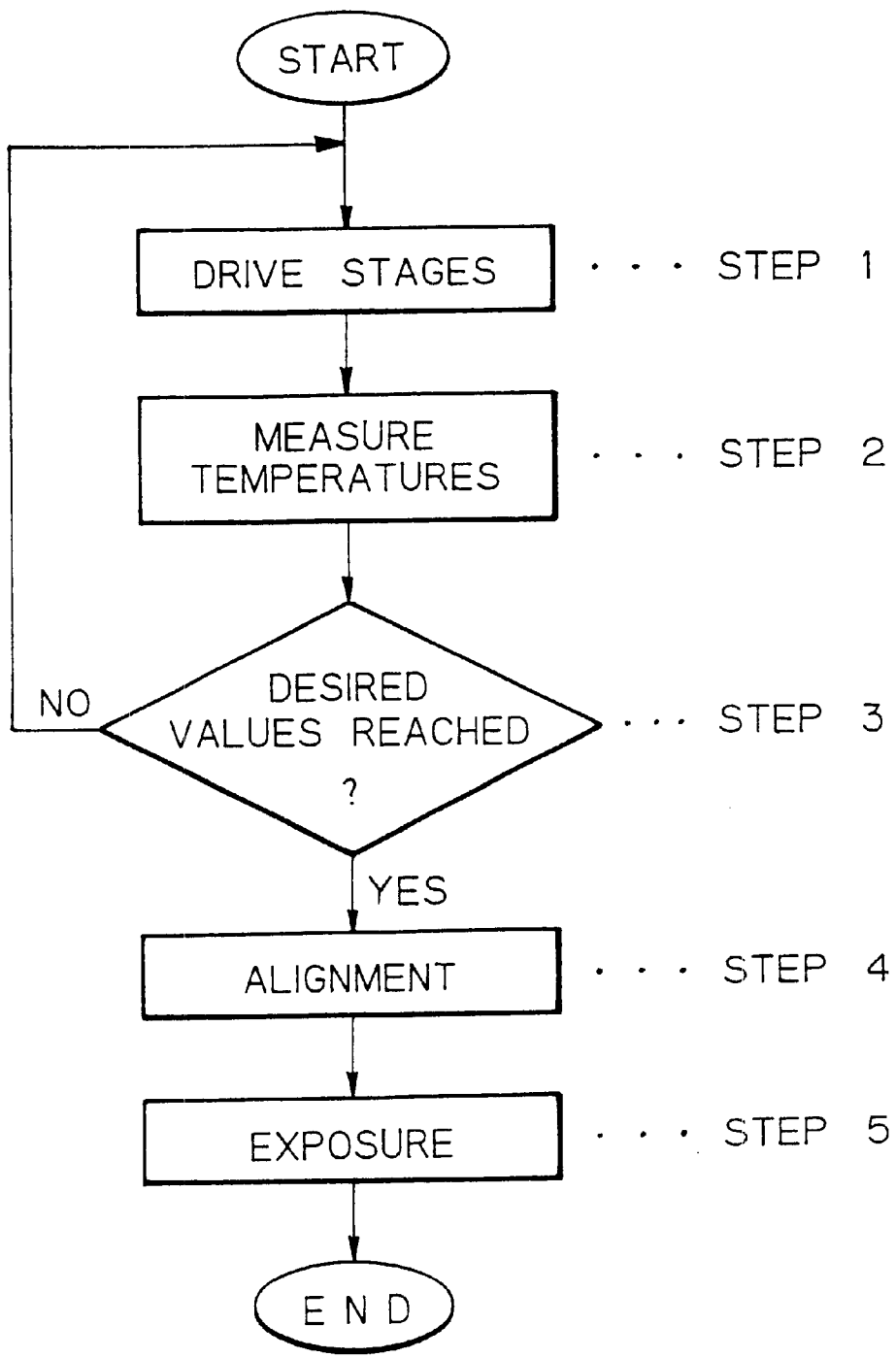
FIG. 3 is a flow chart illustrating the operations of the control system of FIG. 2.

Operations of the embodiment with the above arrangement will now be described with reference to a flow chart shown in FIG. 3.

[Step 1]

The main controller 68 performs, prior to the actual exposure process, a preliminary drive operation in which the main controller 68 drives the reticle stage 32 and the wafer stage (XY-stage) 50 through the reticle stage controller 38 and the wafer stage controller 60, respectively, and by means of the reticle stage drive system 33 and the wafer stage drive system 52, respectively. The preliminary drive operation is an idle drive operation, meaning that the stages 32 and 50 are driven while performing exposure of no actual wafer, in order to stabilize the temperatures at regions near the reticle stage 32 and the wafer stage 50 to a certain extent. For the preliminary drive operation, it is not necessarily required to make such high precision driving of the stages 32 and 50 as required for the actual exposure process. The exposure light beam may be optionally emitted under the control of the main controller 68 during the preliminary drive operation, which is useful for obtaining conditions which more closely resembles those found in the actual exposure process. The emission of the exposure light beam therefore enables more precise adjustment.

[Step 2]

The main controller 68 measures temperatures at regions near the reticle 11 and the wafer 14 through the temperature sensors 40 and 62, respectively, while continuing the idle drive operation. The outputs from the sensors 40 and 62, which represent the measurement results, are continuously supplied to the comparators 64 and 66.

[Step 3]

When the comparisons at the comparators 64 and 66 show that the measurements from the temperature sensors 40 and 62 have reached the desired values, the main controller 68 controls the reticle stage controller 38 and the wafer stage controller 60 to stop the idle drive operation of the reticle stage 32 and the wafer stage 50. If, during the idle drive operation, the measurements from the temperature sensors 40 and 62 would rise towards the desired values only at an unacceptably slow speed, then the heaters 26 and 28 may be operated to raise the temperature of the streams of air introduced from the outlets 18, 20 and 22, within a control range having a width of ±0.1 degree centigrade, so as to force the temperatures at regions near the temperature sensors 40 and 62 to rise more rapidly.

[Step 4]

After the measurements from the temperature sensors 40 and 62 have reached the desired values, which are equilibrium temperatures which would be established during an actual exposure process, the alignment operation for achieving alignment between the reticle stage 32 and the wafer stages (48, 50) is performed.

[Step 5]

Thereafter, an exposure process is commenced. In the exposure process, the reticle stage 32 and the wafer stage 50 are driven to move in synchronism while the positions of the stages 32 and 50 are continuously monitored through the interferometer units 36 and 54, so as to sequentially transfer an image of the pattern on the reticle 11 onto the photoresist-coated wafer 14 and in the exposure areas defined on the wafer 14.

As understood from the above, with the above embodiment, when an exposure process is commenced, the temperatures at regions near the reticle 11 and the wafer 14 have already reached the equilibrium temperatures which would be established during an actual exposure process, so that the temperatures of components around the reticle 11 and the wafer 14 will hardly vary even after a long-time exposure process is continued. Therefore, this embodiment is free from any inconveniences which could be otherwise imposed by the temperature changes with time, such as deformations of the surfaces of the movable and fixed mirrors 34, 56 and 58. Typically, an exposure apparatus is used in a semiconductor device factory which is operated according to a defined diurnal or 24 hours schedule, and thus the time to start the exposure process is fixed to a given point of time in a day. Therefore, a diurnal timer may be implemented in the main controller 68 and be set to automatically start the temperature adjustment operation according to this embodiment a given time (such as, one or two hours) before the start of the exposure process every weekday.

Figure 4:
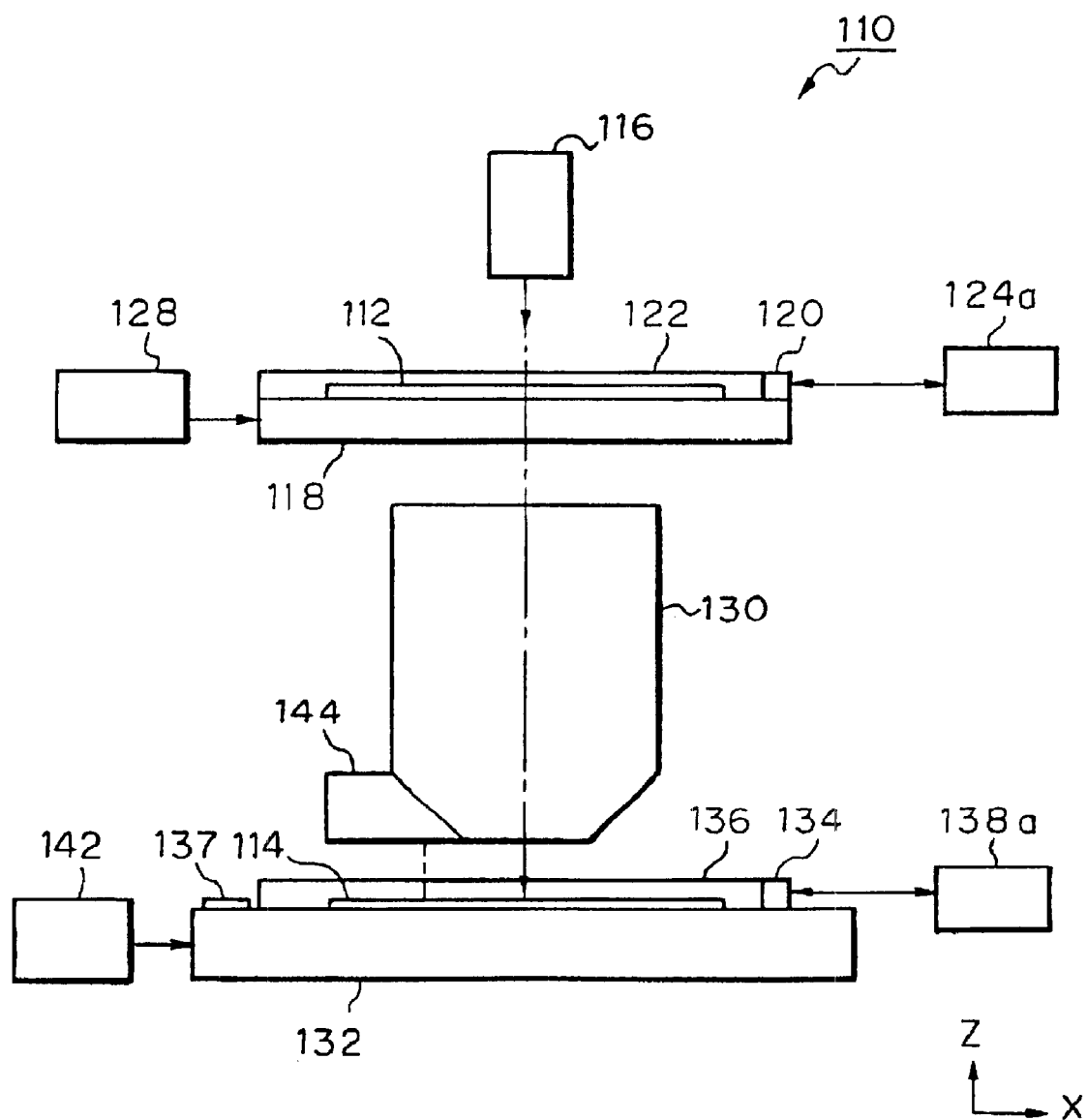
FIG. 4 is a schematic front view showing the construction of a scanning type projection exposure apparatus according to a second embodiment of the present invention.
Figure 5:
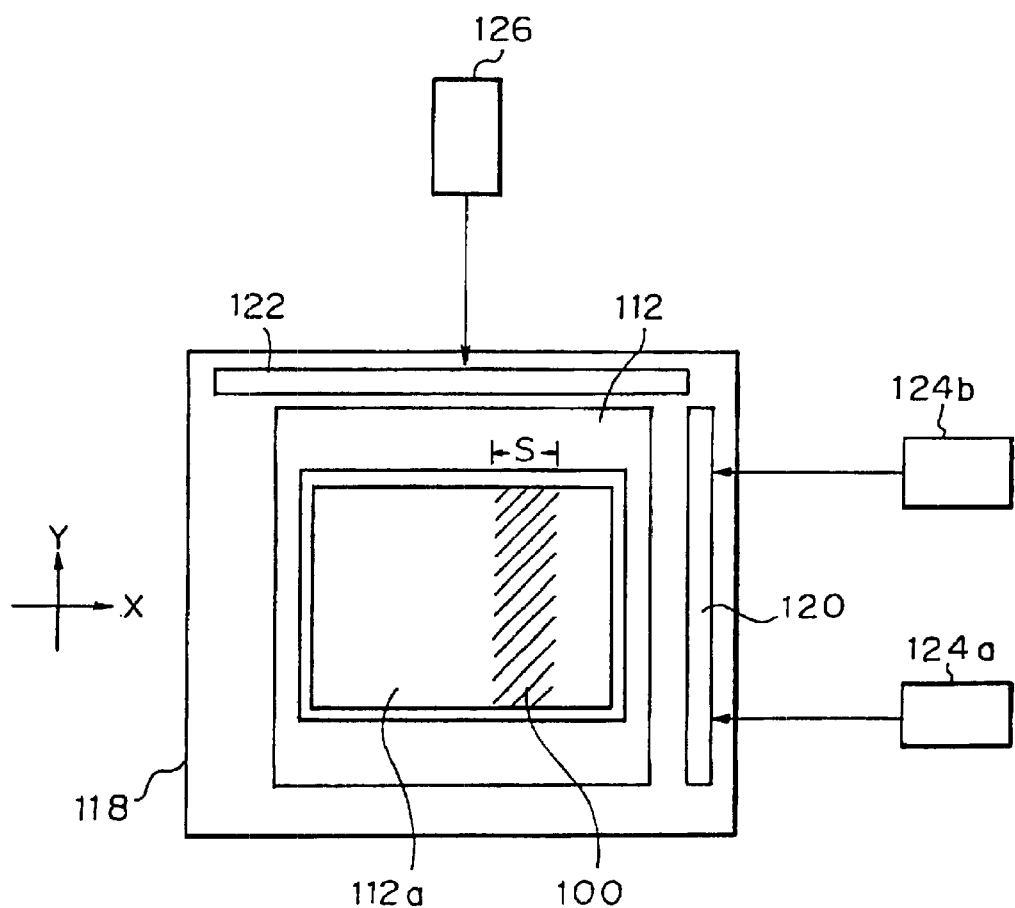
FIG. 5 is a plan view showing an arrangement in an area including a reticle stage in the exposure apparatus of FIG. 4.
Figure 6:
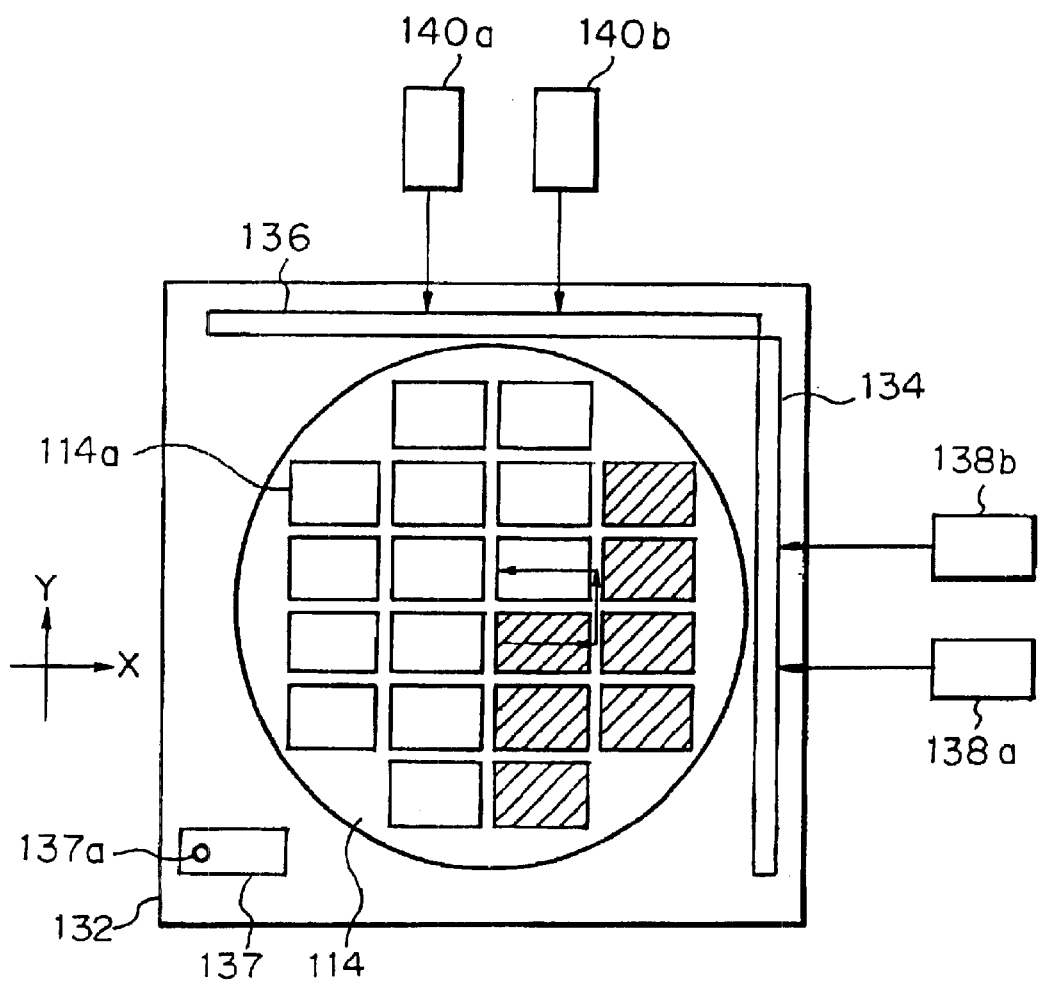
FIG. 6 is a plan view showing an arrangement in an area including a wafer stage in the exposure apparatus of FIG. 4.

FIG. 4 shows an exposure apparatus 110 according to a second embodiment of the present invention. FIG. 5 shows an arrangement in an area including a reticle 112 used in the exposure apparatus 110. FIG. 6 shows an arrangement in an area including a wafer 114 used in the exposure apparatus 110. The exposure apparatus 110 in this embodiment is a projection exposure apparatus of a scanning type, a so-called scanning stepper, in which relative movement between the reticle 112 and the wafer 114 is effected with respect to exposure light so that a plurality of images of a pattern formed on the reticle 112 are successively formed on the wafer 114. The exposure apparatus of FIG. 4 is of the same time type as that of FIG. 1.

The exposure apparatus 110 comprises: an illumination system 116 which irradiates the reticle 112 with an exposure light beam having a slit-shaped illumination area; a movable reticle stage 118 for holding the reticle 112 thereon by vacuum suction; a reticle stage-moving device 128 which moves the reticle stage 118; a projection lens 130 for forming on the wafer 114 an image of a pattern 112a (see FIG. 5) which is formed on the reticle 112; movable wafer stage 132 for holding the wafer 114 thereon by vacuum suction; a wafer stage-moving device 142 which moves the wafer stage 132; and an alignment microscope 144 disposed at a side of the projection lens 130.

Each of the reticle stage 118 and the wafer stage 132 is two-dimensionally movable in a horizontal plane (hereinafter, referred to simply as "x-y plane")of the coordinate system xy defined by the x-axis and the y-axis which are perpendicular to each other. Reflecting mirrors (movable mirrors) 120 and 122 are provided on the reticle stage 118. Interferometers 124a, 124b and 126 (see FIG. 5) are employed to determine the position of the reticle stage 118 in the x-y plane. Illustratively stated, the position (translational component) of the reticle stage 118 with respect to the x-axis of the x-y plane is determined by obtaining an average value of a measurement value of the interferometer 124a and a measurement value of the interferometer 124b, and the rotational component of the reticle stage 118 in the x-y plane is determined from a difference between the measurement value of the interferometer 124a and the measurement value of the interferometer 124b. The position (translational component) of the reticle stage 118 with respect to the y-axis of the x-y plane is measured by the interferometer 126.

On the other hand, reflecting mirrors (movable mirrors) 134 and 136 are provided on the wafer stage 132. Interferometers 138a, 138b, 140a and 140b (see FIG. 6) are employed to determine the position of the wafer stage 132 in the x-y plane. Illustratively stated, the displacement of the wafer stage 132 in a direction of the x-axis (hereinafter, frequently referred to simply as "x direction")is measured by the interferometers 138a and 138b, according to reflection of light from the reflecting mirror 134. The displacement of the wafer stage 132 in a direction of the y-axis (hereinafter, frequently referred to simply as "y direction")is measured by the interferometers 140a and 140b, according to reflection of light from the reflecting mirror 136. The position (translational An component) of the wafer stage 132 with respect to the x-axis is determined by obtaining an average value of a measurement value of the interferometer 138a and a measurement value of the interferometer 138b. The position (translational component) of the wafer stage 132 with respect to the y-axis is determined by obtaining an average value of a measurement value of the interferometer 140a and a measurement value of the interferometer 140b. The rotational component of the wafer stage 132 in the x-y plane is determined by obtaining an average value of a difference between the respective measurement values of the interferometer 138a and the interferometer 138b and a difference between the respective measurement values of the interferometer 140a and the interferometer 140b. The wafer stage 132 has provided thereon a reference member 137 having a reference mark 137a for measurement of a so-called base line which represents a distance between the optical axis of the projection lens 130 and the optical axis of the alignment microscope 144. The height of the surface of the reference member 137 is set as being equal to that of the wafer 114.

As shown in FIG. 5, the circuit pattern 112a is formed in the central area of the reticle 112. This pattern 112a is successively transferred to a plurality of exposure fields 114a (see FIG. 6) in the central area of the wafer 114. The wafer stage 132 is capable of being translationally moved or rotated in the x-y plane by the wafer stage-moving device 142.

In FIG. 5, the reticle 112 is irradiated with an exposure light beam 100 having a slit-shaped illumination area. The slit-shaped illumination area has a length (in a y direction) which is substantially the same as or slightly larger than that of the pattern 112a and a width (in an x direction) designated by character S. During exposure, the reticle 112 and the wafer 114 are moved along the x-axis at predetermined speeds with respect to the exposure light beam 100. When the rate of reduction of the projection lens 130 is, for example, 1/4, the speed ratio of the reticle 112 to the wafer 114 is 4:1. Since the pattern 112a on the reticle 112 is projected through the projection lens 130 on the wafer 114 as an image of the pattern 112a which is rotated at an angle of 180 degrees, the reticle 112 and the wafer 114 are moved in opposite directions (which are plus and minus with respect to the x-axis). With respect to the wafer stage 132, it is moved in a y or x direction by a predetermined distance each time exposure of one of the exposure field 114a is completed, and exposure of another exposure field 114a is conducted. Therefore, the wafer stage 132 is moved in a zigzag manner as indicated by arrows in FIG. 6.

With respect to the alignment microscope 144, it is a microscope of a so-called off-axis type having an optical axis which is different from the optical axis of the projection lens 130. The alignment microscope 144 is adapted to detect several predetermined alignment marks (not shown in the drawings) in a plurality of regions in the wafer 114, and the position (coordinate position in the x-y plane) of the wafer 114 is determined by the least-square approximation method, based on the detected positions of the alignment marks. As a method of detecting alignment marks in the wafer 114, various methods can be employed, such as a method in which a laser beam for detection is moved relative to the alignment marks and scattered light and diffracted light from the alignment marks are detected, or a method in which the images of predetermined alignment marks are formed and detected. Since the optical axis of the alignment microscope 144 is displaced from the optical axis of the projection lens 130, it is required that the amount of base line which is a distance between the optical axis of the alignment microscope 144 and the optical axis of the projection lens 130 be preliminarily measured before exposure and the wafer stage 132 be moved by a distance corresponding to the measured amount of base line at the start of exposure.

Figure 7:
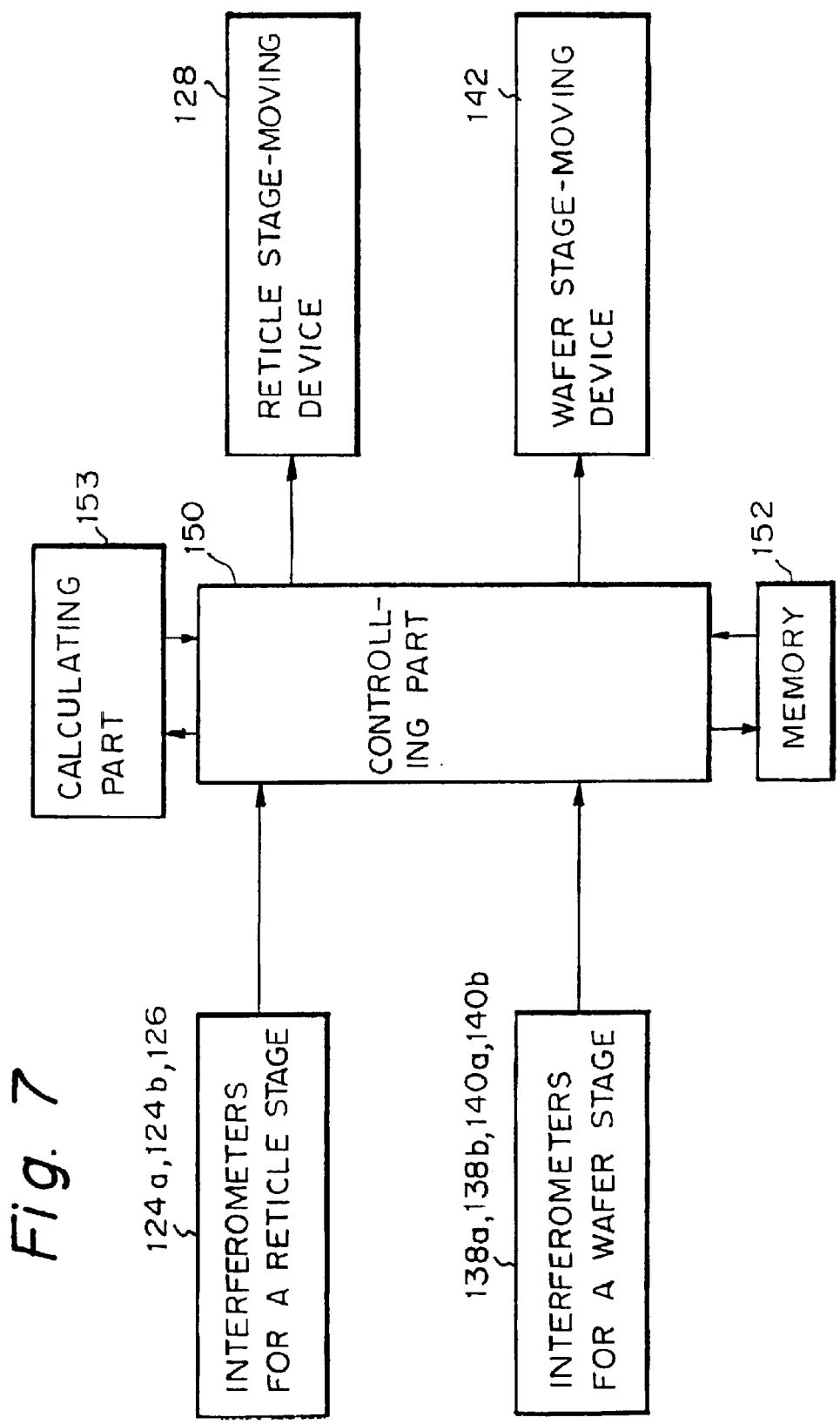
FIG. 7 is a block diagram showing the construction of a control system in the exposure apparatus according to the second embodiment of the present invention.

FIG. 7 is a schematic illustration showing the construction of a control system which controls the reticle stage 118 and the wafer stage 132 in the exposure apparatus 110. In FIG. 7, a controlling part 150 is adapted to comprehensively control the interferometers 124a, 124b and 126 for the reticle stage, the interferometers 138a, 138b, 140a and 140b for the wafer stage, the reticle stage-moving device 128 and the wafer stage-moving device 142. Illustratively stated, the controlling part 150 controls the reticle stage-moving device 128 and the wafer stage-moving device 142, based on information from the interferometers 124a, 124b and 126 and the interferometers 138a, 138b, 140a and 140b with respect to the positions of the reticle stage 118 and the wafer stage 132, to thereby adjust the position of each of the reticle 112 and the wafer 114. The controlling part 150 is connected to a memory 152 for storing therein predetermined information with respect to exposure conditions, etc. and a calculating part 153 which calculates, for example, a standby position of the wafer stage 132, based on the information stored in the memory 152.

Figure 8:
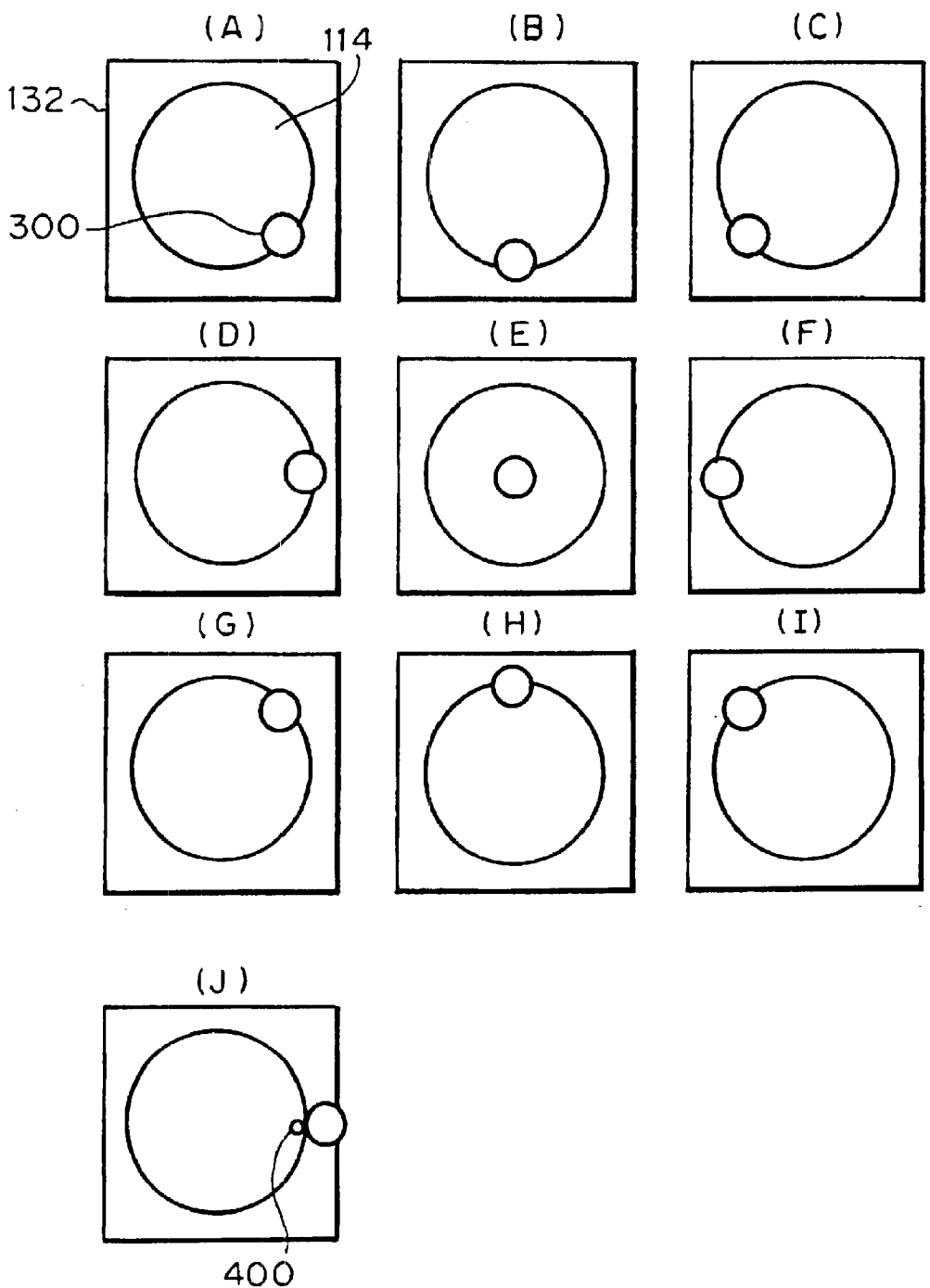
FIG. 8 shows illustrations (A) to (J) explaining movement of a wafer stage relative to a projection lens in the second embodiment of the present invention.

FIG. 8 shows the position (movement) of the wafer stage 132 relative to the projection lens 130 during exposure and alignment of the wafer 114. Illustrations (A) to (J) in FIG. 8 show 10 different positions of the wafer stage 132 relative to the projection lens 130. The position of the projection lens 130 is designated by reference numeral 300 and the position of the alignment microscope 144 is designated by reference numeral 400. Illustrations (A) to (I) show the positions of the wafer stage 132 during exposure of the wafer 114, and illustration (J) shows the position of the wafer stage 132 during alignment of the wafer 114 by the alignment microscope 144. During exposure of the wafer 114, the wafer stage 132 moves the maximum distance corresponding to the diameter of the wafer 114 (e.g., 12 inches). On the other hand, since the alignment microscope 144 is located outside the projection lens 130, during alignment of the wafer 114 [illustration (J)], the wafer stage 132 moves an additional distance over the a maximum distance during exposure of the wafer 114 [illustrations (A) to (J)].

Next will be described a state different from any of the states shown in FIGS. 8(A) to 8(J), that is, the position of the wafer stage 132 during a waiting interval in which no control sequence for exposure of the wafer 114 on the wafer stage 132 is performed. Assume that a wafer change is carried out at time t1, then the alignment operation followed by a series of exposure operations for all of the exposure areas on the new wafer is performed, and then the wafer is again changed with the next one at time t2. During the waiting interval, the wafer stage 132 is caused to wait at a position (the waiting position) which corresponds to the temporal average of the positions of the wafer stage 510 over the time during which the control sequence for exposure of the wafer 114 is performed. That is, representing the positions of the wafer stage 132 during the time interval t1 to t2 as (X(t), Y(t)), the waiting position (X, Y) for the wafer stage 132 is determined as the function of time t that is expressed as $$(X, Y) = \left( \frac{\int_{t1}^{t2} X(t)\,dt}{t2-t1}, \frac{\int_{t1}^{t2} Y(t)\,dt}{t2-t1} \right)$$

The time (t2−t1) can be determined by calculations in the calculating part 153, based on various conditions which are preliminarily determined, such as an optimum exposure time [univocally determined from the thickness and properties (photosensitivity) of a photoresist coating of the wafer 114, a degree of reflection of a base of the wafer 114 and an illumination power of the exposure apparatus], the respective positions of a plurality of alignment marks (which are measured as coordinate positions by the alignment microscope 144), the number of alignment marks, a time required for detection for alignment, and a time required for exchanging wafers. The values of the factors relating to individual wafer types may be stored in the memory unit 152.

In calculating the standby position (X, Y) of the wafer stage 132 in a manner as mentioned above, when information on the above-mentioned various conditions with respect to the wafer to be used after the standby period are stored in the memory 152, the time (t2−t1) is determined, based on the conditions of the wafer to be used after the standby period, and the standby position (X, Y) of the wafer stage 132 (or the average position of the wafer sage 132 with respect to the time) is calculated in accordance with the above-mentioned formula. When information on the conditions of the wafer to be used after the standby period is not stored in the memory 152, the time (t2−t1) is determined, based on conditions of the wafer which has been used in the actual operation just prior to the standby period, and the standby position (X, Y) of the wafer stage 132 is calculated in accordance with the above-mentioned formula.

In the above-mentioned second embodiment of the present invention, during the standby period, the wafer stage 132 is held at a position which is an average position relative to the time (actual operation time) during which exposure control operations with respect to the wafer stage 132 are conducted. Therefore, when exposure control operations are restarted after the standby period, radical changes in temperature conditions in the exposure apparatus do not occur, so that an operation of exposure can be stably conducted, without changes in amount of base line of the alignment microscope 144, bending of the reflecting mirrors 134 and 136, temperature changes in optical paths for the interferometers 138a, 138b, 140a and 140b and various changes in a telecentric portion of the projection lens 130 in which temperature conditions are not controlled.

As in the case of the wafer stage 132, the standby position of the reticle stage 118 is determined as a position which is an average position relative to the time (actual operation time) during which exposure control operations with respect to the reticle stage 118 are conducted. Incidentally, during exposure, the reticle stage 118 is accelerated and decelerated repeatedly while moving in an x direction with respect to the exposure light beam 100, so that the above-mentioned average position (standby position) of the reticle stage 118 corresponds to the center of an exposure field of the reticle 112. Therefore, the standby position of the reticle stage 118 becomes a position such that the center of an exposure field of the reticle 112 coincides with the center of the exposure light beam 100. Generally, the pattern 112a formed on the reticle 112 corresponds to the center of the reticle 112 as a whole. In this case, the standby position of the reticle stage 118 is a position such that the center of the reticle 112 as a whole coincides with the center (optical axis) of the projection lens 130. Thus, the reticle stage 118 is held at a position which is an average position relative to the actual operation time, so that, as in the case of the wafer stage 132, when exposure control operations are restarted after the standby period, radical changes in temperature conditions in the exposure apparatus do not occur and hence, an operation of exposure can be stably conducted.

Figure 9:
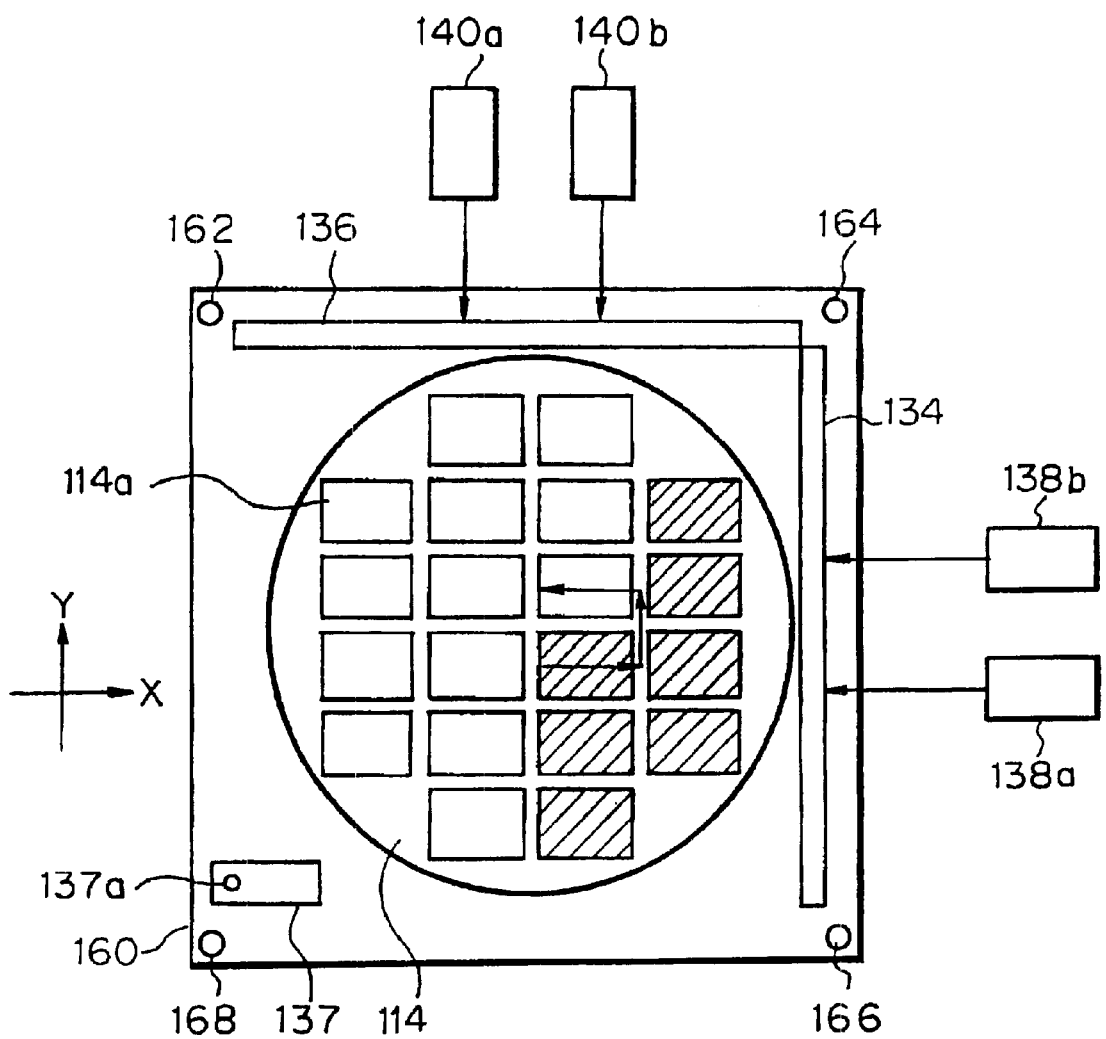
FIG. 9 is a plan view showing an arrangement in an area including a wafer stage in an exposure apparatus according to a third embodiment of the present invention.

FIG. 9 is a plan view showing an arrangement in an area including a wafer stage 160 in an exposure apparatus according to a third embodiment of the present invention. In FIG. 9, the same members or portions as those in FIG. 6 are denoted by the same reference numerals, and overlapping is avoided with respect to descriptions of those members or portions. The wafer stage 160 in this embodiment has substantially the same construction as that of the wafer stage 132 in the second embodiment of the present invention (FIG. 6), except that temperature sensors 162, 164, 166 and 168 are provided at four corners of the wafer stage. The standby position of the wafer stage 160 is determined, based on measurement values of temperatures of the temperature sensors 162, 164, 166 and 168. That is, as the standby position of the wafer stage 160, a thermally stable position is calculated from measurement values of temperatures of the temperature sensors 162, 164, 166 and 168.

Figure 10:
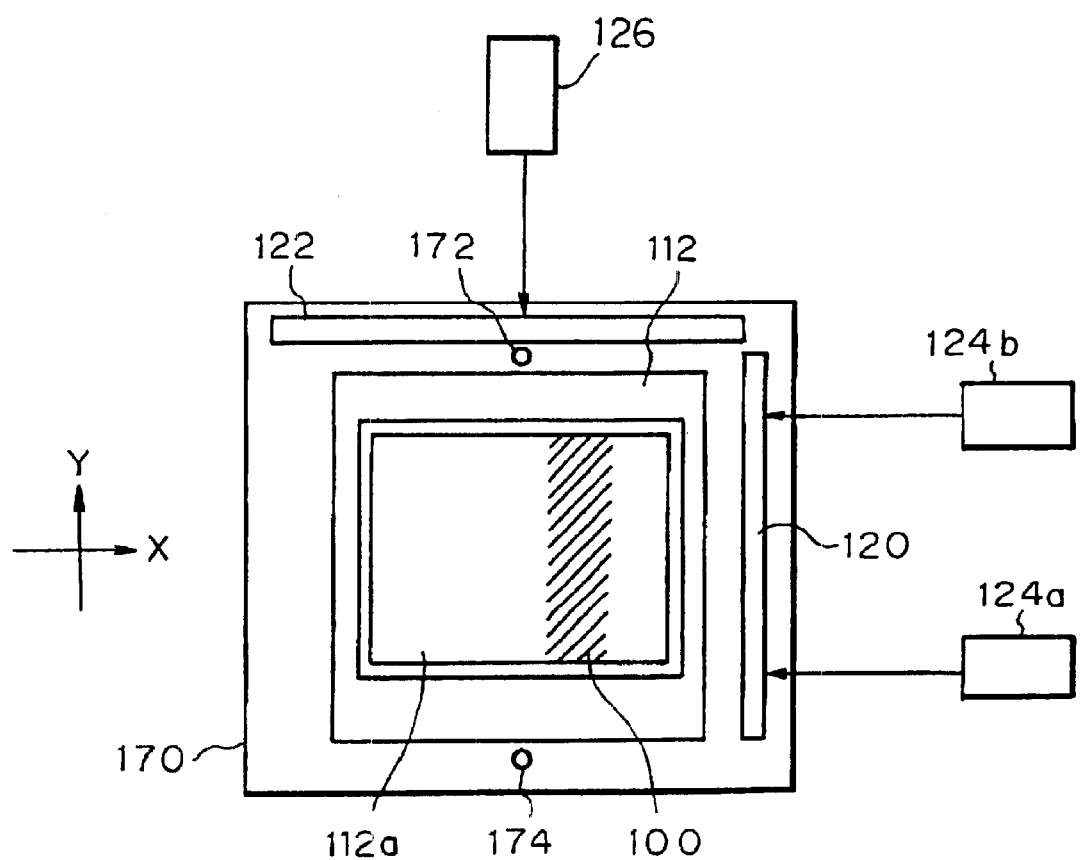
FIG. 10 is a plan view showing an arrangement in an area including a reticle stage in the exposure apparatus according to the third embodiment of the present invention.

FIG. 10 is a plan view showing an arrangement in an area including a reticle stage 170 in an exposure apparatus according to the third embodiment of the present invention. In FIG. 10, the same members or portions as those in FIG. 5 are denoted by the same reference numerals, and overlapping is avoided with respect to descriptions of those members or portions. The reticle stage 170 in this embodiment has substantially the same construction as that of the reticle stage 118 in the second embodiment of the present invention (FIG. 5), except that temperature sensors 172 and 174 are provided at an upper edge and a lower edge of the reticle stage (as viewed in FIG. 10). The standby position of the reticle stage 170 is determined, based on measurement values of temperatures of the temperature sensors 172 and 174. That is, as the standby position of the reticle stage 170, a thermally stable position is calculated from measurement values of temperatures of the temperature sensors 172 and 174.

Figure 11:
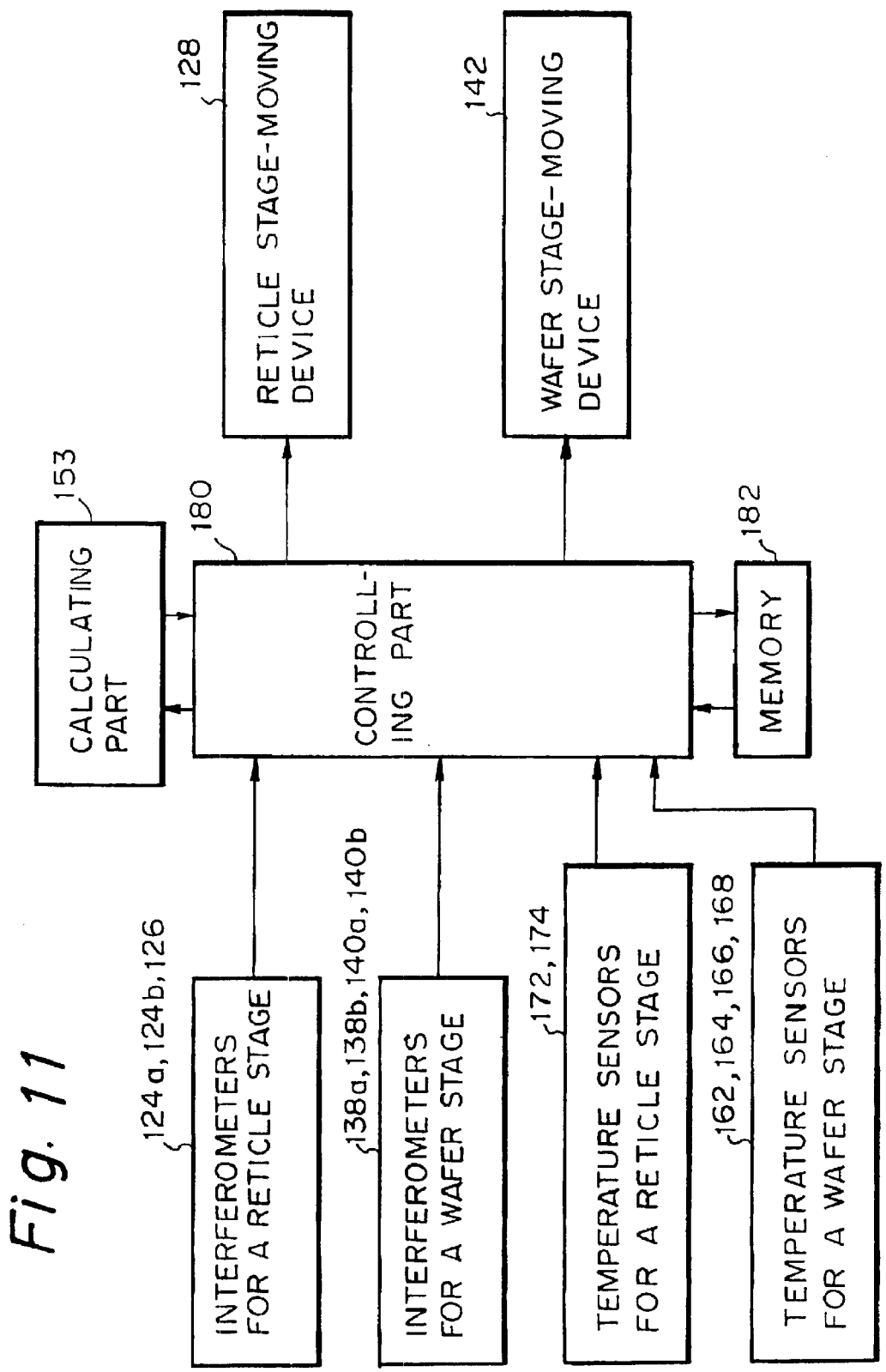
FIG. 11 is a block diagram showing the construction of a control system in the exposure apparatus according to the third embodiment of the present invention.

FIG. 11 is a block diagram showing the construction of a control system in the exposure apparatus according to the third embodiment of the present invention. In FIG. 11, the same members or portions as those in FIG. 7 are denoted by the same reference numerals, and overlapping is avoided with respect to descriptions of those members or portions. In this embodiment, as in the second embodiment shown in FIG. 7, a controlling part 180 is adapted to comprehensively control the interferometers 124a, 124b and 126 for the reticle stage, the interferometers 138a, 138b, 140a and 140b for the wafer stage, the reticle stage-moving device 128 and the wafer stage-moving device 142. The controlling part 180 is connected to the temperature sensors 162, 164, 166 and 168 for the wafer, the temperature sensors 172 and 174 for the reticle, a memory 182 and the calculating part 153.

In the third embodiment of the present invention, the wafer stage 160 is actually moved during the standby period according to the exposure time, the number of alignment marks and the like. While moving the wafer stage 160, measurements of temperatures (temperature changes) are conducted by the temperature sensors 162, 164, 166 and 168. Information on the measurement values of temperatures is stored in the memory 182 by the controlling part 180. Subsequently, the controlling part 180 supplies the information on measurement values of temperatures (temperature changes) stored in the memory 182 to the calculating part 153, which calculates an average value of the measurement values of temperatures with respect to each of the temperature sensors 162, 164, 166 and 168. Subsequently, while gradually moving the wafer stage 160, outputs from the temperature sensors 162, 164, 166 and 168 are observed. 4 positions (X1, Y1), (X2, Y2), (X3, Y3) and (X4, Y4) of the wafer stage 160 at each of which the measurement value of temperature of the temperature sensor becomes the above-calculated average temperature value of the temperature sensor, with respect to each of the temperature sensors 162, 164, 166 and 168, is determined. An average position (X0, Y0) of the positions (X1, Y1), (X2, Y2), (X3, Y3) and (X4, Y4) of the wafer stage 160 is calculated as the standby position (thermally stable position) of the wafer stage 160 in the calculating part 153.

As mentioned above, in the third embodiment of the present invention, the wafer stage 160 is held at an average position (X0, Y0) of the positions (X1, Y1), (X2, Y2), (X3, Y3) and (X4, Y4) at each of which the measurement value of temperature of the temperature sensor becomes an average temperature value of the temperature sensor, with respect to each of the temperature sensors 162, 164, 166 and 168. Therefore, as in the second embodiment of the present invention, when exposure control operations are restarted after the standby period, radical changes in temperature conditions in the exposure apparatus do not occur and hence, an operation of exposure can be stably conducted.

With respect to the reticle stage 170, as in the case of the wafer stage 160, the reticle stage 170 is actually moved during the standby period under the same conditions as in the actual operation. While moving the reticle stage 170, measurements of temperatures (temperature changes) are conducted by the temperature sensors 172 and 174. Information on the measurement values of temperatures is stored in the memory 182 by the controlling part 180.

Subsequently, the controlling part 180 supplies the information on measurement values of temperatures (temperature changes) stored in the memory 182 to the calculating part 153, which calculates an average value of the measurement values of temperatures with respect to each of the temperature sensors 172 and 174. Subsequently, while gradually moving the reticle stage 170, outputs from the temperature sensors 172 and 174 are observed. Two positions of the reticle stage 170 at each of which the measurement value of temperature of the temperature sensor becomes the above-calculated average temperature value of the temperature sensor, with respect to each of the temperature sensors 172 and 174, is determined. An average position of those two positions of the reticle stage 170 is calculated as the standby position (thermally stable position) of the reticle stage 170 in the calculating part 153.

Next, a fourth embodiment of the present invention is explained. The fourth embodiment of the present invention is a modification of the above-mentioned third embodiment. In the fourth embodiment, during the standby period, the wafer stage 160 is moved between the positions (X1, Y1), (X2, Y2), (X3, Y3) and (X4, Y4) at each of which the measurement value of temperature of the temperature sensor becomes an average temperature value of the temperature sensor, with respect to each of the temperature sensors 162, 164, 166 and 168, instead of holding the wafer stage 160 at the average position (X0, Y0) of the positions (X1, Y1), (X2, Y2), (X3, Y3) and (X4, Y4). With respect to the reticle stage 170, as in the case of the wafer stage 160, during the standby period, the reticle stage 170 is moved between two positions at each of which the measurement value of temperature of the temperature sensor becomes an average temperature value of the temperature sensor, with respect to each of the temperature sensors 172 and 174. By the arrangement of the fourth embodiment, as in the case of the third embodiment, when exposure control operations are restarted after the standby period, radical changes in temperature conditions in the exposure apparatus do not occur and hence, an operation of exposure can be stably conducted.

Next, a fifth embodiment of the present invention is explained. In the fifth embodiment, the wafer stage 160 shown in FIG. 9 and the reticle stage 170 shown in FIG. 10 are employed. In this embodiment, during the standby period during which exposure control operations are suspended, that is, the period of time between the unloading of the wafer 114 after exposure from the wafer stage 160 and the loading of another wafer onto the wafer stage 160, movements of the wafer stage 160 and the reticle stage 170 in the actual operation are traced. In other words, during the standby period, the wafer stage 160 and the reticle stage 170 is moved as following movements of the wafer stage 160 and the reticle stage 170 in the actual operation. Illustratively stated, differing from conventional exposure techniques in which the exposure apparatus is stopped during the standby period, the wafer stage 160 on which no wafers 114 are provided is moved in a manner such that its movement (scanning movement and stepping movement) during alignment and exposure of the wafer 114 in the actual operation is traced. Further, with respect to the reticle stage 170, as in the case of the wafer stage 160, the reticle stage 170 is moved in a manner such that its movement during exposure in the actual operation is traced. That is, scanning movement of the reticle stage 170 in an x direction is repeated synchronously with the movement of the wafer stage 160.

Figure 12:
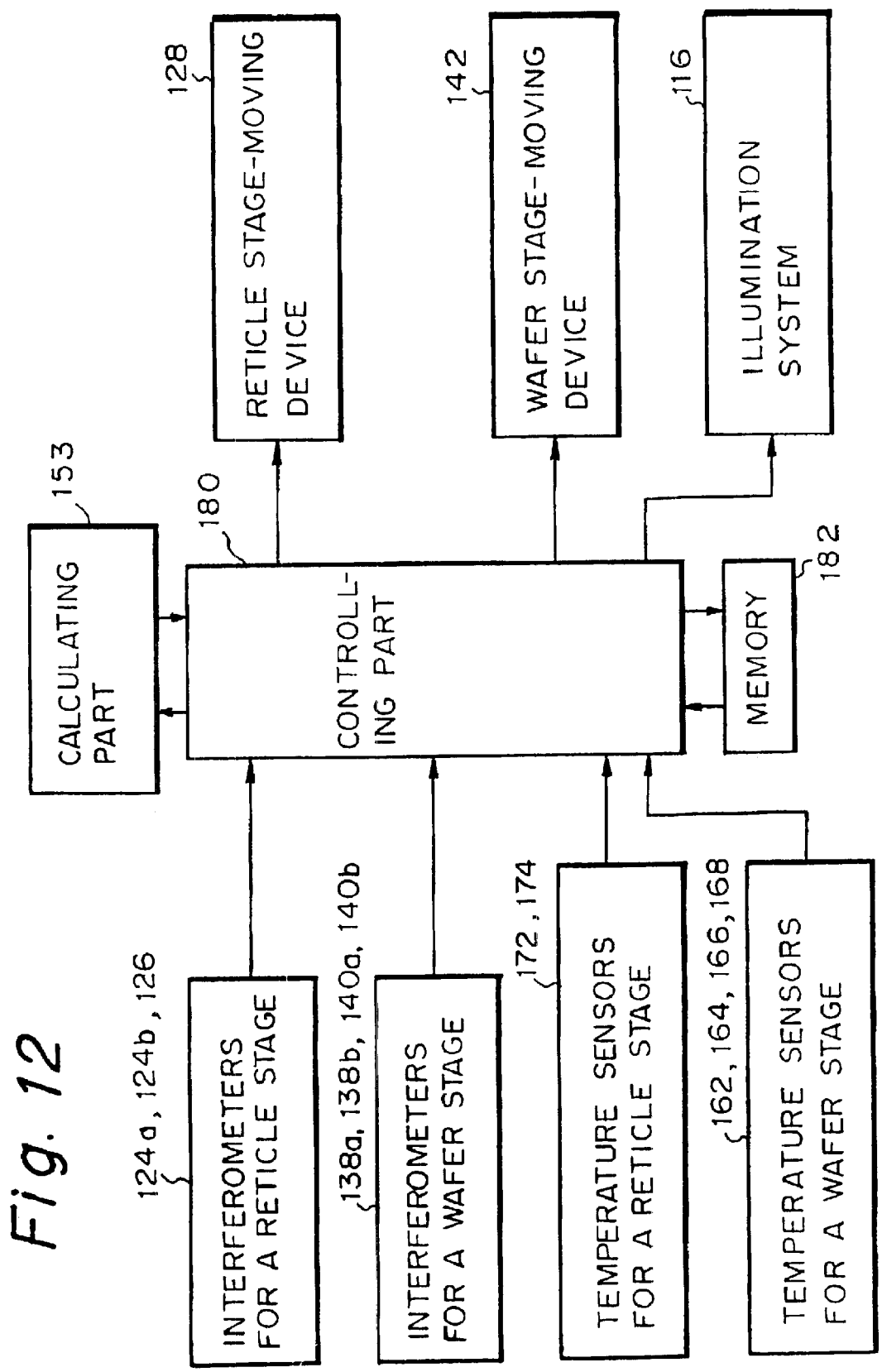
FIG. 12 is a block diagram showing the construction of a control system in an exposure apparatus according to a fifth embodiment of the present invention.

FIG. 12 is a block diagram showing the construction of a control system in the exposure apparatus according to the fifth embodiment of the present invention. In FIG. 12, the same members or portions as those in FIG. 11 are denoted by the same reference numerals, and overlapping is avoided with respect to descriptions of those members or portions. In this embodiment, during the standby period, the controlling part 180 controls the reticle stage-moving device 128 and the wafer stage-moving device 142, to thereby move the reticle stage 170 and the wafer stage 160, respectively, based on the information stored in the memory 182. In this instance, the controlling part 180 continuously monitors the position of each of the reticle stage 170 and the wafer stage 160, based on signals supplied from the interferometers 124a, 124b and 126 for the reticle stage and the interferometers 138a, 138b, 140a and 140b for the wafer stage. Further, the controlling part 180 reads a preliminarily set data file with respect to the wafer to be used after the standby period (such as the amount of exposure light, the number of shots of exposure light, the positions of shots of exposure light and the positions of alignment marks), the alignment microscope and the like, and controls the reticle stage-moving device 128 and the wafer stage-moving device 142 so that the reticle stage 170 and the wafer stage 160 precisely trace their movements in the actual operation, that is, the time required for alignment, the position of the wafer stage 160 during alignment, the time required for exposure and the like in the actual operation are applied during the movement of the reticle stage 170 and the wafer stage 160 during the standby period.

In the fifth embodiment of the present invention, during the standby period, the wafer stage 160 and the reticle stage 170 are moved in a manner such that their movements in the actual operation are traced. In the present invention, during the standby period, in addition to moving the wafer stage 160 and the reticle stage 170 in the above-mentioned manner, irradiation of exposure light may be performed. That is, the controlling part 180 may control the illumination system 116 so that the reticle 112 is irradiated with exposure light during the standby period in the same manner as in the actual operation. In this instance, exposure light passes through the reticle 112 and the projection lens 130, and reaches the wafer stage 160.

The controlling part 180 may control the illumination system 116 during the standby period, in a manner different from that in the actual operation. That is, the controlling part 180 may control the illumination system 116 during the standby period so that the amount of exposure light which reaches the wafer stage 160 is smaller than that in the actual operation. The reason for this arrangement is as follows: Although the temperature of the wafer 114 rises during exposure, when the wafer 114 after exposure is replaced by another wafer for the subsequent exposure, heat exchange occurs. Therefore, if the wafer stage 160 is irradiated with exposure light during the standby period in the same amount as that in the actual operation, the temperature of the wafer stage 160 becomes undesirably high during exposure after the standby period.

For the above-mentioned reason, it is preferred in the present invention that the amount of exposure light during the standby period be made smaller than that in the actual operation by, for example, covering a light-reducing filter over a light source or reducing the time during which exposure light is emitted from the light source. When the time during which exposure light is emitted is reduced, it is preferred that a timing of emitting exposure light be changed so that exposure light is emitted at various times, for example, immediately after the start of scanning, when each of the reticle stage and the wafer stage is located at an intermediate scanning position and just prior to the completion of scanning, so as for the reticle not to be heated only at a specific portion thereof.

During the standby period, the controlling part 180 controls the reticle stage-moving device 128, the wafer stage-moving device 142 and the illumination system 116, based on signals from the temperature sensors 172 and 174 for the reticle and the temperature sensors 162, 164, 166 and 168 for the wafer. When the measurement value of temperature of each of the temperature sensors is likely to exceed the temperature in the actual operation (target temperature), irradiation of exposure light by the illumination system 116 is stopped or the amount of exposure light irradiated by the illumination system 116 is reduced. On the other hand, when the measurement value of temperature of each of the temperature sensors is considerably low as compared to the target temperature, the amount of exposure light irradiated by the illumination system 116 is increased. The temperature in the actual operation (target temperature) with respect to each of the temperature sensors is preliminarily measured during the actual operation before the standby period, and stored in the memory 182. The feedback control system arranged as mentioned above ensures that the same temperature conditions as those in the actual operation are maintained with high accuracy during the standby period. In this embodiment, the controlling part 180 controls the reticle stage-moving device 128, the wafer stage-moving device 142 and the illumination system 116, based on the measurement values of temperatures of all the temperature sensors 162, 164, 166 and 168 provided on the wafer stage 160. However, in the present invention, the controlling part 180 may control the reticle stage-moving device 128, the wafer stage-moving device 142 and the illumination system 116, only based on the measurement value of temperature of the temperature sensor 168 which is the nearest temperature sensor relative to the reference member 137.

As mentioned above, in the fifth embodiment of the present invention, during the standby period, the wafer stage 160 and the reticle stage 170 are moved in a manner such that their movements in the actual operation are traced, so that when exposure control operations are restarted after the standby period, the temperature conditions in the exposure apparatus are already the same as those in the actual operation and hence, immediately after the start of exposure control operations, radical changes in temperature conditions in the exposure apparatus do not occur. Therefore, drifts of measurement values of various sensors, such as the alignment microscope 144 and an auto focus system (not shown in the drawings), can be suppressed.

Further, because various disadvantages, such as rotation of the reference member 137 on the wafer stage 160 relative to the reflecting mirrors 134 and 136, are obviated, an error of measurement of a distance between the optical axis of the projection lens 130 and the optical axis of the alignment microscope 144 (i.e., the amount of a so-called base line) can be suppressed. Incidentally, in the fifth embodiment of the present invention, both the wafer stage 160 and the reticle stage 170 are moved during the standby period. However, the effect of the present invention can be satisfactorily achieved by moving only one of the wafer stage 160 and the reticle stage 170.

Embodiments of the present invention have been described above. However, the present invention is not limited to the above-mentioned embodiments. Various modifications are possible without departing from the scope of the present invention as defined in the appended claims.

The entire disclosure of Japanese Patent Applications Nos. Hei 7-328281 filed on Nov. 22, 1995, Hei 8-61848 filed on Feb. 23, 1996, Hei 8-353551 filed on Dec. 17, 1996, and U.S. patent application Ser. No. 09/299,152 (which is a Continuation Application of U.S. patent application Ser. No. 08/752,875 filed on Nov. 20, 1996) and U.S. patent application Ser. No. 08/990,580 (which is a CPA application of U.S. patent application Ser. No. 08/990,580 field on Dec. 15, 1997) are incorporated herein by reference in its entirety.

What is claimed is:

1. An exposure method for transferring a pattern formed on a mask onto a plurality of substrates, wherein each substrate is supported on a substrate stage in order, said method comprising the steps of:

controlling a position of the substrate stage in accordance with an exposure control operation for the respective substrate; and positioning the substrate stage in a thermally stabilized position in a moving area of the substrate stage during a waiting interval in which the exposure control operation with respect to the substrate stage is not performed.

2. An exposure method according to claim 1, wherein:

the thermally stabilized position is a position under the same temperature conditions as experienced during which the exposure control operation for exposure of a substrate is performed.

3. An exposure method according to claim 1, further comprising:

positioning a mask stage that holds the mask in the thermally stabilized position in the moving area of the mask stage during a waiting interval in which the exposure control operation with respect to the mask stage is not performed.

4. An exposure method according to claim 1, wherein:

the thermally stabilized position corresponds to the temporal average of the positions of the substrate stage over the time during which the exposure control operation for exposure of a substrate is performed.

5. An exposure method according to claim 1, wherein:

said exposure method is a scanning type in which relative movement between the mask and the substrate is effected with respect to exposure light so that a plurality of images of the pattern formed on the mask are transferred onto the substrate.

6. A method for producing a semiconductor device comprising projecting a pattern of a mask onto the substrate through a projection system using the exposure method as claimed in claim 1.

* * * * *